United States Patent [19]

Kunishima et al.

[11] Patent Number: 5,168,332
[45] Date of Patent: Dec. 1, 1992

[54] SEMICONDUCTOR DEVICE HAVING SALICIDE STRUCTURE, METHOD OF MANUFACTURING THE SAME, AND HEATING APPARATUS

[75] Inventors: Iwao Kunishima, Tokyo; Tomonori Aoyama; Kyoichi Suguro, both of Yokohama, all of Japan

[73] Assignee: Kabushiki Kaisha Toshiba, Kawasaki, Japan

[21] Appl. No.: 617,793

[22] Filed: Nov. 26, 1990

[30] Foreign Application Priority Data

Nov. 27, 1989 [JP] Japan .................................. 1-307322

[51] Int. Cl.⁵ .......................................... H01L 29/10
[52] U.S. Cl. .................................... 257/385; 257/627; 257/900
[58] Field of Search .................. 357/23.4, 23.9, 34, 357/59, 61, 67

[56] References Cited

U.S. PATENT DOCUMENTS 4,949,136 8/1990 Jain ..................................... 357/23.4

OTHER PUBLICATIONS

"Transmission electron microscopy of the formation of nickel silicides", Philosophical Magazine A, 1982, vol. 45, No. 1, 35-47, H. Föll et al.
"Formation of Ultrathin Single-Crystal Silicide Films on Si: Surface and Interfacial Stabilization of Si-NiSi$_2$ Expitial Structures" vol. 50, No. 6, Feb. 7, 1983, R. T. Tung et al.
"Comparison of Cobalt and Titanium Silicides for Salicide Process and Shallow Junction Formation", VMIC Conference, pp. 241-250, Jun. 12-13, 1989.
Tung et al., Physical Review Letters, vol. 50, No. 6, Feb. 7, 1983, pp. 429-432.

*Primary Examiner*—Edward J. Wojciechowicz
*Attorney, Agent, or Firm*—Oblon, Spivak, McClelland, Maier & Neustadt

[57] ABSTRACT

A semiconductor device including a semiconductor substrate of a first conductivity type. An insulative film and metal films are sequentially formed on the main top surface of the semiconductor substrate. Impurity diffusion layers of a second conductivity type are selectively formed on the main top surface of the semiconductor substrate. The semiconductor device further includes metal compound layers consisting of constituting elements of the semiconductor substrate and a metal element. The metal compound layers are formed in the impurity diffusion layers in such a manner that they do not contact the insulative film, and the metal compound layers on the main back surface side of the semiconductor substrate have faces formed in parallel to the top surface of the semiconductor substrate.

4 Claims, 7 Drawing Sheets

SEMICONDUCTOR DEVICE HAVING SALICIDE STRUCTURE, METHOD OF MANUFACTURING THE SAME, AND HEATING APPARATUS

BACKGROUND OF THE INVENTION

1. Field of the Invention

The present invention relates to a semiconductor device with a SALICIDE structure having a metal silicide selectively formed on a diffusion layer or the like. The present invention also relates to a method for manufacturing the above semiconductor device, and a heating apparatus for use in the manufacturing method.

2. Description of the Related Art

Conventionally, MOS type field effect transistors (FET) have been used as basic devices of an LSI. Improving the LSI performance demands higher performance of MOS transistors. To improve the transistors' performance, it is important to form a diffusion layer, such as source/drain regions, shallow.

A low-accelerating ion injection is widely used as a method for forming a diffusion layer of a MOS transistor. Recently, an impurity (e.g., As) diffusion method has also been used. The use of these methods can form shallow source/drain regions of an about 0.1 $\mu$ depth. With regard to the p+/n junction, it is possible to form shallow source/drain regions. More specifically, such shallow source/drain regions can be realized by injecting $Si^+$, $Ge^+$ or $Sn^+$ ions to make the surface layer of an Si single crystal non-crystalline, then injecting $BF_2$ ions at a low acceleration. In this case, it is possible to realize an about 0.1 $\mu$ depth even after a heat treatment to make the region active.

This diffusion layer having a depth of about 0.1 $\mu$ however has a high sheet resistance of 100 $\Omega/\square$ or greater. Improving the speed of a semiconductor device therefore requires that the resistance be made smaller by rendering the surface of the diffusion layer metallic.

Recently, therefore, a study has been made on a so-called SALICIDE, a method of forming silicides on the surfaces of a polycrystal Si gate region and source/drain regions selectively and through self-alignment. According to this method, an insulative film is formed on the side wall of the polycrystal Si gate after formation of an impurity diffusion layer, metal such as titanium (Ti) is deposited on the entire surface of the substrate, subjecting this metal to heat treatment such as lamp annealing to make only the gate, drain and source regions silicide through self-alignment, then etching out that metal portion which has not been reacted.

$TiSi_2$ (Ti silicide) is typically used to reduce the sheet resistance of the impurity diffusion layer. $TiSi_2$, however, has the following shortcomings, as disclosed in Chih-Shih Wei, Gopal Raghavan, M. Lawrence A. Dass, Mike Frost, Teodoro Brat and David B. Fraster, VMIC Conference, p. 241–p250, Jun. 12-13, 1989.

First, the film stress of $TiSi_2$ is tensile and has a value of 2 to $2.5\times10^{10}$ dynes/cm$^2$. The high stress in $TiSi_2$ tends to introduce more defects in the Si substrate. These defects may degrade the junction integrity.

Second, because Si is the diffusing species during $TiSi_2$ formation, it tends to diffuse from gate and S/D regions into the Ti overlayer and to form a silicide bridge over the spacer regions resulting in a gate-S/D shorting problem.

SUMMARY OF THE INVENTION

It is therefore a primary object of the present invention to provide a highly reliable semiconductor device which can inhibit a metal compound layer from penetrating the lower portion of an insulative film formed on the side wall of a gate electrode to thereby prevent the gate from being damaged.

It is the second object of the present invention to provide a semiconductor device which has impurity diffusion layers, such as source/drain regions, formed shallower, and can prevent a current from leaking to the substrate side, thus reducing the resistance of the impurity diffusion layer.

It is the third object of the present invention to provide a heating apparatus which is used in a method for manufacturing the above semiconductor devices and can easily provide a predetermined temperature gradient for semiconductor devices.

To achieve the first object, according to one aspect of the present invention, there is provided a semiconductor device comprising: a semiconductor substrate of a first conductivity type having main top and back surfaces; an insulative film selectively formed on the main top surface of the semiconductor substrate; metal films formed on the insulative film; impurity diffusion layers of a second conductivity type selectively formed on the main top surface of the semiconductor substrate; and metal compound layers consisting of constituting elements of the semiconductor substrate and a metal element, and formed in the impurity diffusion layers in a manner not contacting the insulative film, the metal compound layers on a side of the main back surface of the semiconductor substrate having faces formed in parallel to the main top surface of the semiconductor substrate.

According to another aspect of the present invention, there is provided a semiconductor device comprising: a semiconductor substrate of a first conductivity type having main top and back surfaces; an insulative film selectively formed on the main top surface of the semiconductor substrate; metal films formed on the insulative film; impurity diffusion layers of a second conductivity type selectively formed on the main top surface of the semiconductor substrate; and metal compound layers consisting of constituting elements of the semiconductor substrate and a metal element, and formed in the impurity diffusion layers in a manner not contacting the insulative film, interfaces between the metal compound layers and the impurity diffusion layers being formed flat.

It is preferable that the main top surface of the semiconductor substrate be a {100} face, and the metal compound layers be surrounded by a {100} face at bottom portions and a {111} face at side portions.

According to the semiconductor devices having the above structures, since the metal compound layers do not reach the bottom of the insulative film selectively formed on the main top surface of the semiconductor substrate, it is possible to prevent the insulative film and metal films from being damaged. In addition, the metal compound layers can be made sufficiently thick, making it possible to set the resistance between the impurity diffusion layers and electrodes formed thereon through the metal compound layers smaller. Further, with the main top surface of the semiconductor substrate, and the bottom and side portions of the metal compound layers selected to have the above specified faces, although the metal compound layers would grow in the depth direction of the substrate, they hardly grow in the direction parallel to the top surface of the substrate. The lengths of those regions where the metal compound layers overlap the insulative film formed on the side walls of a film lamination (gate) comprising an insulative film and metal films can be made significantly shorter (e.g., 1/10 of the thickness of the metal compound layers). This can surely prevent the gate from being damaged and also make the resistance of the impurity diffusion layers smaller.

To achieve the second object, according to one aspect of the present invention, there is provided a method for manufacturing a semiconductor device, comprising the steps of: forming a metal film on a main top surface of a semiconductor substrate of a first conductivity type having a main back surface; selectively forming metal compound layers consisting of an alloy of semiconductor materials constituting the semiconductor substrate and a metal material constituting the metal film, at a contact portion between the metal film and the semiconductor substrate; injecting an impurity of a second conductivity type in the metal compound layers; and providing a temperature gradient to set a temperature on a side of the main top surface of the semiconductor substrate lower than a temperature on the main back surface thereof, whereby the impurity concentrates on faces of the metal compound layers on the main back surface side of the semiconductor substrate and impurity diffusion layers of the second conductivity type are formed between the metal compound layers and the semiconductor substrate.

According to another aspect of the present invention, there is provided a method for manufacturing a semiconductor device, comprising the steps of: forming a metal film on a main top surface of a semiconductor substrate of a first conductivity type having a main back surface; selectively forming metal compound layers consisting of an alloy of semiconductor materials constituting the semiconductor substrate and a metal material constituting the metal film, at a contact portion between the metal film and the semiconductor substrate; injecting an impurity of a second conductivity type in the metal compound layers; and providing a temperature gradient to set a temperature on a side of the main top surface of the semiconductor substrate lower than a temperature on the main back surface thereof, whereby a density of the impurity at interfaces between the metal compound layers and the semiconductor substrate becomes high, and impurity diffusion layers of the second conductivity type are formed between the metal compound layers and the semiconductor substrate.

According to a different aspect of the present invention, there is provided a method for manufacturing a semiconductor device, comprising the steps of: forming a metal film on a main top surface of a semiconductor substrate of a first conductivity type having a main back surface; injecting an impurity of a second conductivity type in the metal film; selectively forming metal compound layers consisting of an alloy of semiconductor materials constituting the semiconductor substrate and a metal material constituting the metal film, at a contact portion between the metal film and the semiconductor substrate; and providing a temperature gradient to set a temperature on a side of the main top surface of the semiconductor substrate lower than a temperature on the main back surface thereof, whereby the impurity concentrates on faces of the metal compound layers on the main back surface side of the semiconductor substrate and impurity diffusion layers of the second conductivity type are formed between the metal compound layers and the semiconductor substrate.

According to a further aspect of the present invention, there is provided a method for manufacturing a semiconductor device, comprising the steps of: forming a metal film on a main top surface of a semiconductor substrate of a first conductivity type having a main back surface; injecting an impurity of a second conductivity type in the metal film; selectively forming metal compound layers consisting of an alloy of semiconductor materials constituting the semiconductor substrate and a metal material constituting the metal film, at a contact portion between the metal film and the semiconductor substrate; and providing a temperature gradient to set a temperature on a side of the main top surface of the semiconductor substrate lower than a temperature on the main back surface thereof, whereby a density of the impurity at interfaces between the metal compound layers and the semiconductor substrate becomes high, and impurity diffusion layers of the second conductivity type are formed between the metal compound layers and the semiconductor substrate.

According to the above-described methods for manufacturing a semiconductor device, the mentioned temperature gradient is provided between the semiconductor substrate and the metal compound layers after injecting an impurity in the metal film formed on the main top surface of the semiconductor substrate or the metal compound layers, and the impurity is diffused on the substrate side to form the impurity diffusion layers of the second conductivity type. In other words, providing such a temperature gradient that the temperature on the substrate side is higher than the temperature on the side of the metal compound layers increases the segregation coefficient of the impurity between the metal compound layers and the substrate on the substrate side to thereby maximize the impurity density at the interfaces between the metal compound layers and the substrate. This structure can therefore provide impurity diffusion layers which, even if formed shallower, have a high impurity density, thus reducing the resistance of the impurity diffusion layers. Further, as the impurity density of the impurity diffusion layers become higher, an increase in leak current due to the concentration of an electric field can be suppressed.

To achieve the third object, a heating apparatus according to the present invention comprises: a container for retaining a semiconductor substrate having main top and back surfaces; heaters disposed on respective sides of the main top and back surfaces of the semiconductor substrate; and means for spraying cool gas on the main top surface of the semiconductor substrate to thereby provide a predetermined temperature gradient between the top and back surfaces of the semiconductor substrate.

Since the heating apparatus with the above structure is equipped with the heaters for heating the semiconductor substrate and the gas spraying means for cooling the main top surface of the substrate, the mentioned temperature gradient can easily be provided between the main top surface (on the side of the metal compound layers) of the substrate and the main back surface thereof.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE PREFERRED EMBODIMENTS

The present invention will now be described in detail referring to preferred embodiments illustrated in the accompanying drawings.

Figure 1A:
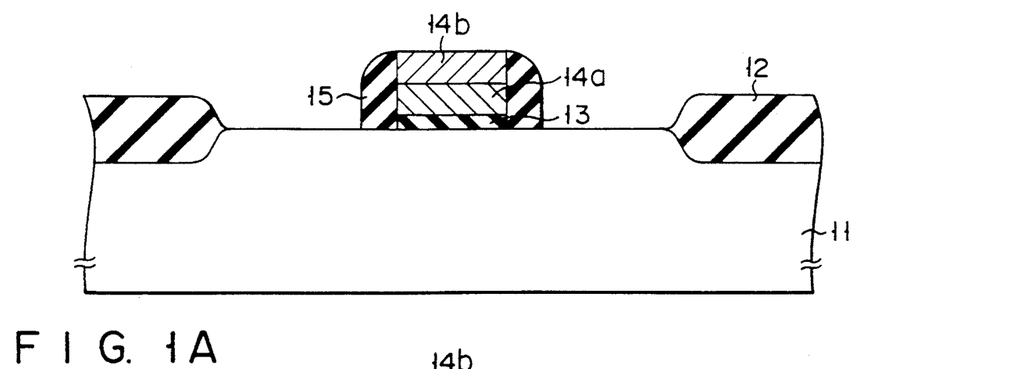
FIGS. 1A to 1E are cross sections illustrating the steps of manufacturing a semiconductor device according to the first embodiment of the present invention.

FIGS. 1A to 1E are cross-sectional views illustrating the steps of manufacturing a semiconductor device according to the first embodiment of the present invention. As shown in FIG. 1A, a 800-nm thick field oxidation film 12 is formed, by thermal oxidation, on an n type Si substrate 11 (semiconductor substrate of a first conductivity type) whose main surface is a (100) face. The main surface of the Si substrate 11 may be a (010) face or (001) face, instead of the (100) face. On a device-forming region surrounded by the oxidation film 12 are sequentially deposited a 10-nm thick gate oxidation film 13, a 150-nm thick As-doped polycrystal silicon film 14a, and a 150-nm thick tungsten silicide ($WSi_2$) film 14b. The resultant laminated films are etched in a gate electrode pattern to provide a gate electrode portion. Then, a CVD-$SiO_2$ film is deposited 50 nm thick, then subjected to anisotropic etching, thus forming an $SiO_2$ film 15 (insulative film) on the side wall of the gate.

Figure 1B:
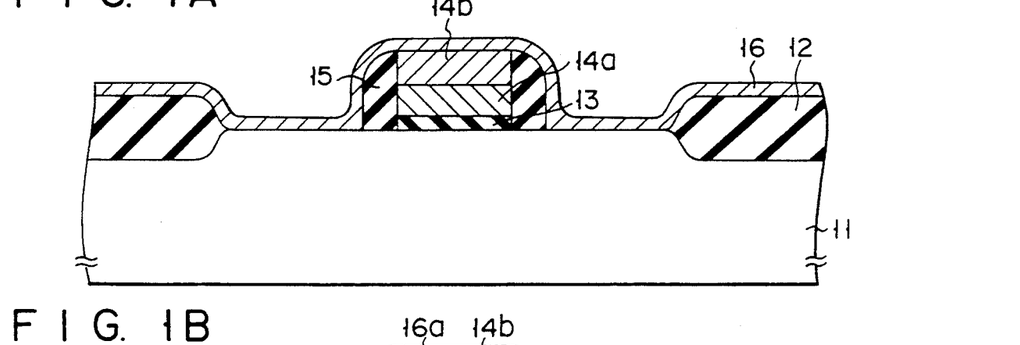
Figure 1C:
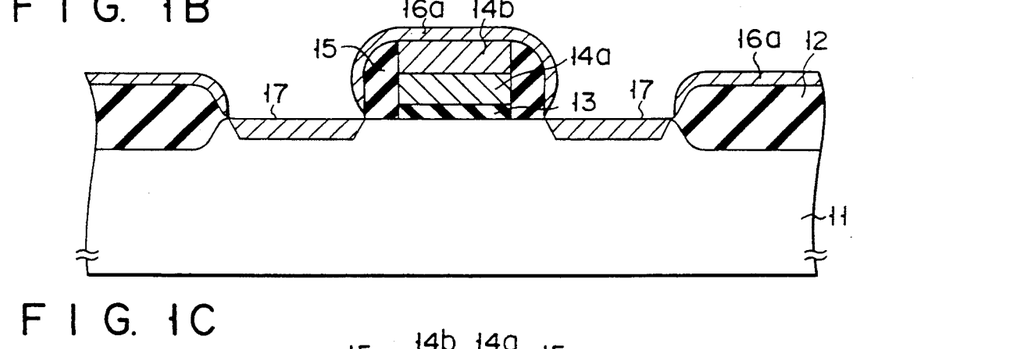

A metal film such as an Ni film 16 is deposited 40 nm thick on the entire surface of the Si substrate 11 using a sputtering method, as shown in FIG. 1B. Through one-hour annealing at 850° C. in the $N_2$ atmosphere, nickel silicide ($NiSi_2$) layers 17 (metal compound layer) are formed approximately 150 nm thick. Reference numeral "16a" denotes an unreacted Ni layer.

Figure 1D:
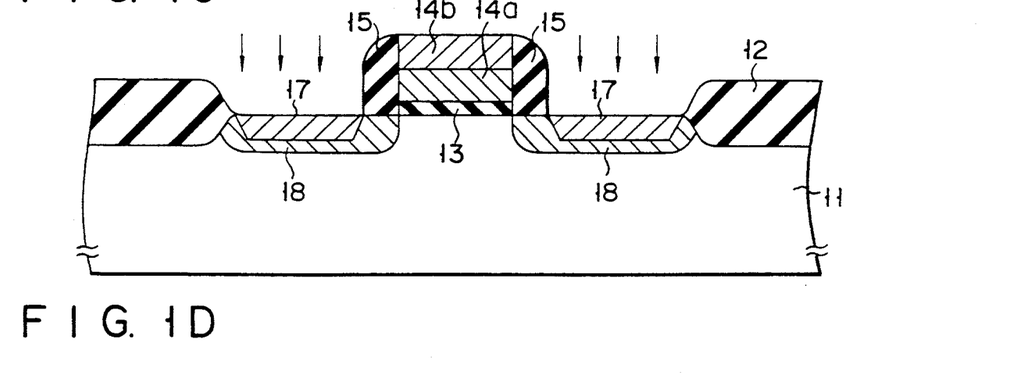

The unreacted Ni layer 16a is removed at the normal temperature using solution mixed with HCl and $H_2O_2$, as shown in FIG. 1D. The ratio of HCl to $H_2O_2$ in the mixed solution is set to 3:1. The $NiSi_2$ layers 17 are formed in source/drain regions through self-alignment. Though having grown approximately 150 nm thick in the direction of the depth of the Si substrate 11, the $NiSi_2$ layers 17 hardly grow in a direction parallel to the surface of the Si substrate 11, and the $NiSi_2$ layers 17 do not penetrate under the $SiO_2$ film 15 formed on the side wall of the gate electrode portion. Further, the $NiSi_2$ layers 17 each have its bottom surrounded by the (100) face of the Si substrate 11, and its side portions surrounded by (111), (1$\bar{1}$1), (11$\bar{1}$), and (1$\bar{1}\bar{1}$) faces.

Boron ions ($B^+$) are then injected into the $NiSi_2$ layers 17 with an acceleration voltage of 40 keV and a dose amount of $1 \times 10^{16}$ cm$^{-2}$. Lamp annealing is performed for 22 sec at 1050° C. The boron is diffused into the Si substrate 11 from the $NiSi_2$ layers 17, forming approximately 0.1-$\mu$m thick diffusion layers 18 (impurity diffusion layers of a second conductivity type).

Figure 1E:
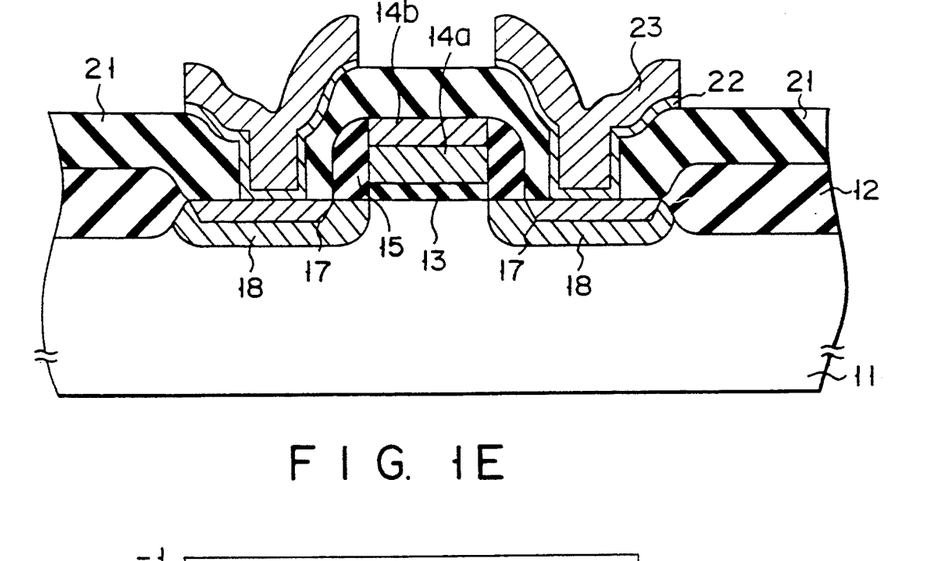

A CVD-$SiO_2$ film 21, an interlayer insulative film, is deposited 1 $\mu$m thick on the entire surface of the Si substrate 11, as shown in FIG. 1E. Contact holes are formed in the CVD-$SiO_2$ film 21 on the source/drain regions. In the contact holes are formed, for example, an electrode pattern including a lamination of a TiN film 22 and an Al.Si alloy film 23, thereby completing a field-effect transistor.

Figure 2:
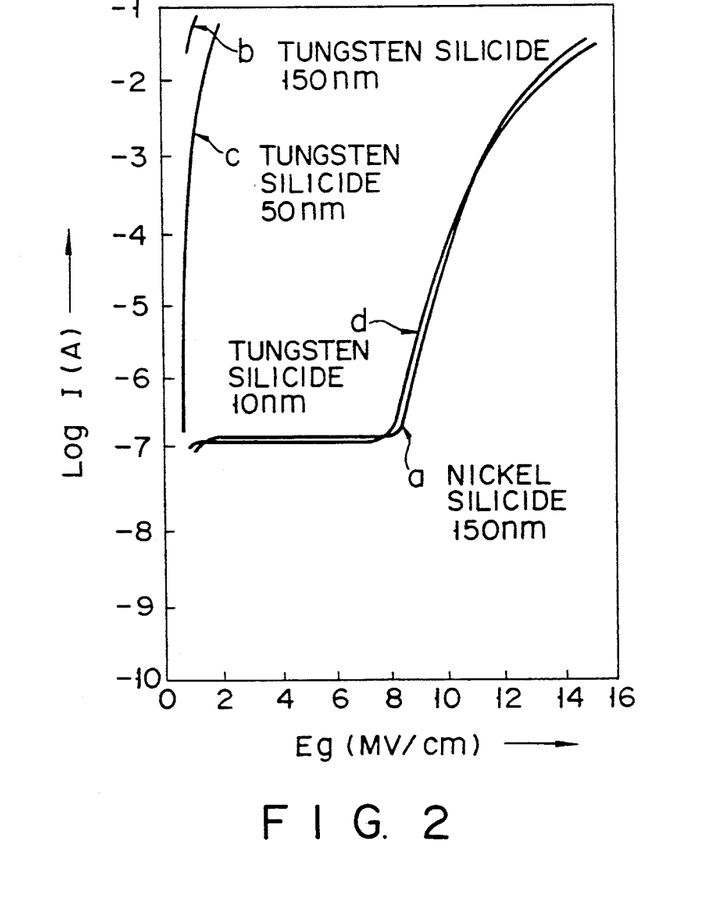
FIG. 2 is a diagram illustrating an $E_G$-I characteristic curve of the semiconductor device according to the first embodiment compared with that of the semiconductor device formed using a W silicide.

The gate breakdown voltage of a MOSFET fabricated in the above manner was examined. FIG. 2 illustrates the relation between a leak current I and the gate electric field $E_G$ of the MOSFET manufactured by the method of this embodiment, and the $E_G$-I relation of a MOSFET fabricated by the present inventors using a W silicide (the latter relation will be described later). A curve a shows the $E_G$-I characteristic of the embodiment in a case where the $SiO_2$ film 15 is 50 nm thick and the $NiSi_2$ layers 17 are 150 nm thick. Curves b, c, and d show the $E_G$-I characteristics of the MOSFET produced using the W silicide; the $SiO_2$ film formed on the side wall of the gate is 50 nm thick for all the curves, b, c, and d, and the W silicide layer is 150 nm thick for the curve b, 50 nm thick for the curve c, and 10 nm for the curve d. It should be apparent from FIG. 2 that the FET fabricated using the W silicide has an obvious gate damage when the thickness (50 nm) of the metal silicide is three times that (150 nm) of the $SiO_2$ film on the side wall of the gate, whereas the FET fabricated using the Ni silicide according to this embodiment has no gate damage and shows a good $E_G$-V characteristic. It is also obvious that the W silicide layer should have a thickness of approximately 10 nm to make the $E_G$-I characteristic of the gate of the W-silicide used MOSFET almost equal to that of the MOSFET of this embodiment. If the W silicide layer is too thin, however, the sheet resistance would increase, and the operation speed would decrease.

Figure 3A:
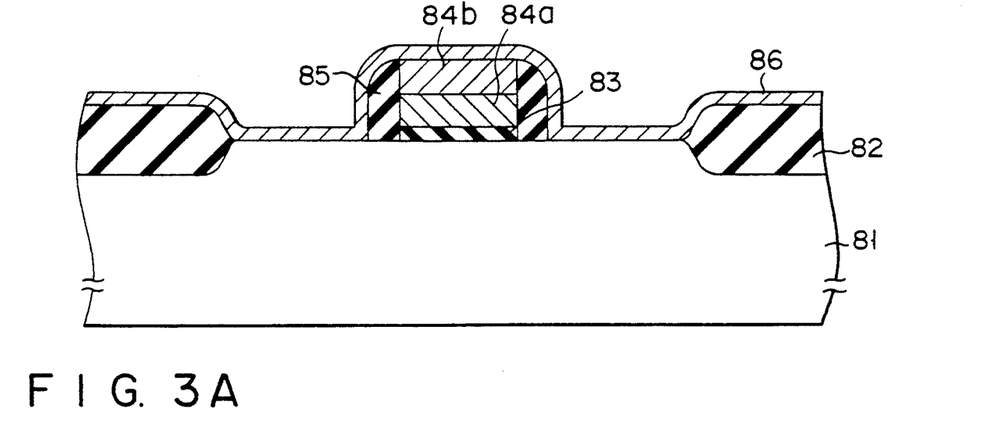
FIGS. 3A to 3C are cross sections illustrating the steps of manufacturing the semiconductor device using the W silicide.
Figure 3B:
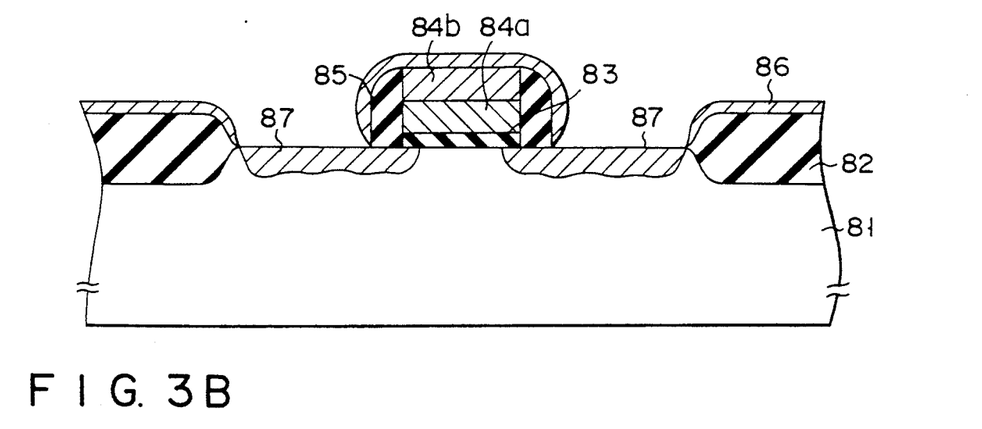
Figure 3C:
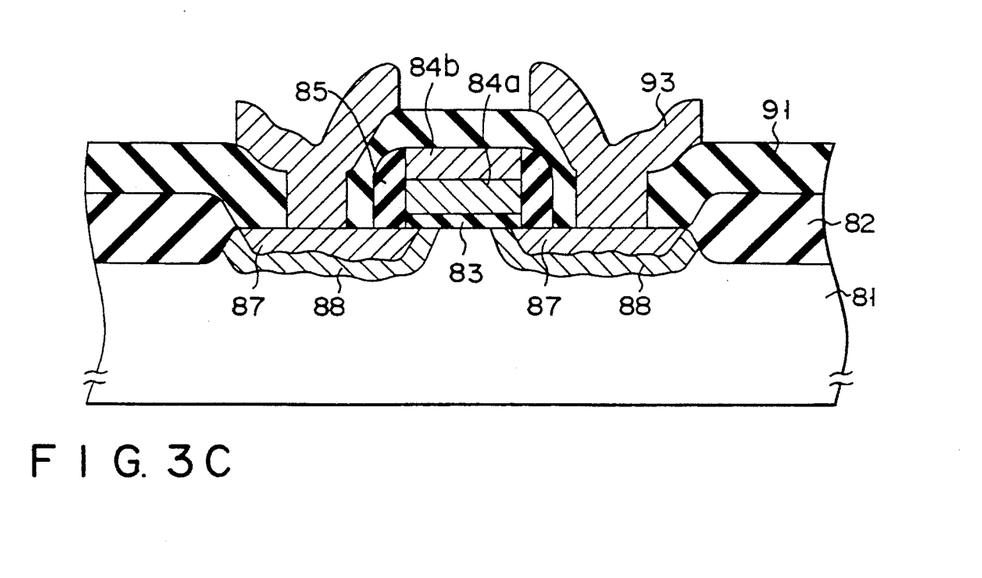

FIGS. 3A through 3C are cross-sectional views illustrating the steps of manufacturing a MOS transistor using the above described W silicide.

As shown in FIG. 3A, a W film 86 is deposited on an Si substrate 81 whose silicon surface surrounded by a field oxidation film 82 and an approximately 50-nm thick insulative film 85 formed on the side wall of the gate electrode. Referring to this diagram, reference numeral "83" denotes a gate oxidation film, "84a" a polycrystal silicon film, and "84b" a W silicide film. Then, this Si substrate 81 is heated by lamp annealing to form W silicide layers 87 on the Si-exposed surface as shown in FIG. 3B. The unreacted portion of the W film 86 is then etched out as shown in FIG. 3C. An impurity element is ion-injected in the W silicide layers 87 and the top of the resultant structure is heated by the lamp annealing to form shallow impurity diffusion layers 88. Finally, an interlayer insulative film 91 is formed on the Si substrate 81, contact holes are formed on the resultant structure, then electrodes 93 are formed, thus completing a MOSFET. The use of this manufacturing method can form W silicide layers with a thickness of 150 nm, for example, and can reduce the sheet resistance to 3 to 5 $\Omega/\square$.

The reason why this embodiment could prevent the gate destruction is as follows. In a MOSFET using a W silicide, the growing speed of the W silicide in the depth direction of the substrate 81 is almost equal to that in the direction parallel to the substrate 81. This permits the W silicide layers 86 to penetrate the lower portion of the $SiO_2$ film 85 formed on the side wall of the gate electrode, and further lower portion of the gate oxidation film 83. As a result, stress would be applied to both ends of the gate ($SiO_2$ film 83, polycrystal silicon film 84a, W silicide film 84b), which may damage the gate oxidation film 83 or the gate electrode (polycrystal silicon film 84a, W silicide film 84b). In contrast, according to the MOSFET of this embodiment, the growing speed of the Ni silicide in the direction parallel to the substrate 11 is considerably slower than that in the depth direction of the substrate 11 (about one tenth). Even if the 150-nm thick Ni silicide layers 17 are formed, therefore, the penetration of the Ni silicide layers 17 into the lower portion of the $SiO_2$ film 15 on the side wall of the gate electrode can be suppressed to a level that such is hardly observed, thus preventing the gate oxidation film 13 or the gate electrode from being damaged.

According to this embodiment, therefore, in a semiconductor device using a metal silicide and having a shallow junction structure, $NiSi_2$ is selected as the metal silicide to prevent the $NiSi_2$ layers 17 from penetrating into the lower portion of the $SiO_2$ film 15 on the gate's side wall. Even the formation of the $NiSi_2$ layers 17 with a sufficient thickness to acquire a low sheet resistance would not result in destruction of the gate electrode or the like, thus realizing a MOSFET having a good electric characteristic.

Although $NiSi_2$ is used as a metal silicide in the above-described embodiment, other metal compounds can also be used as long as their growing speed in the depth direction of the substrate difference from the growing speed in the direction parallel to the substrate and they can be treated in the same manner as $NiSi_2$. Specifically, such metal compounds are those which epitaxially grow on the Si surface and include palladium silicide ($Pd_2Si$), platinum silicide (PtSi, $Pt_2Si$), iridium silicide ($IrSi_3$), rhodium silicide ($Rh_3Si_4$), iron silicide ($FeSi_2$), ruthenium silicide (RuSi), osmium silicide ($OsSi_2$) and hafnium silicide ($HfSi_2$). Further, although impurity diffusion layers are formed after the formation of the metal silicide layers in this embodiment, the formation order may be reversed to form the impurity diffusion layer before the metal silicide layers. Furthermore, although the $NiSi_2$ is formed directly in the embodiment, it may be formed after forming $Ni_2Si$ or NiSi first, then etching the unreacted Ni.

Figure 4A:
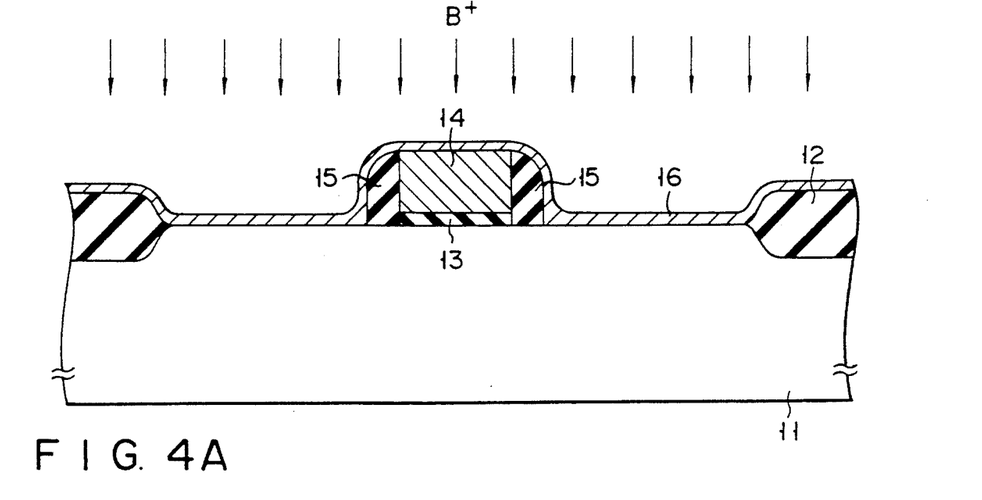
FIGS. 4A to 4D are cross sections illustrating the steps of manufacturing a semiconductor device according to the second embodiment of the present invention.

FIGS. 4A to 4D are cross sections illustrating the steps of manufacturing a semiconductor device according to the second embodiment of the present invention. As shown in FIG. 4A, a 0.6-$\mu$m thick field oxidation film 12 is formed on an n type Si substrate 11 (semiconductor substrate of a first conductivity type) which has a (100) face and a specific resistance of 4 to 5 $\Omega$ cm. On a device-forming region surrounded by the oxidation film 12 are sequentially deposited a 10-nm thick gate oxidation film 13, a 300-nm thick As-doped polycrystal silicon film 14. The individual films 13 and 14 are processed through the reactive ion etching (RIE) into a gate electrode pattern. Then, a 0.15-$\mu$m thick $SiO_2$ film (insulative film on the gate's side wall) is formed on the side wall of the laminated films with the gate electrode pattern. Then, the natural oxidation film on the surface of the Si substrate 11 is removed by using solution of diluted hydrofluoric acid, the resultant Si substrate 11 is cleaned in pure water with an oxygen density of 1 ppm or less, is dried in the $N_2$ atmosphere, is then set in a vacuum tank. The pressure in the vacuum tank is depressurized to or below $1 \times 10^{-5}$ Pa and the 30-nm thick Ni film 16 is formed on the entire surface of the Si substrate 11 by the electron beam evaporation. Alternatively, Ar may be introduced into the vacuum tank to set the internal pressure to 0.5 to 0.7 Pa, then Ni is sputtered on the resultant structure to form the Ni film 16 on the entire surface of the Si substrate 11. Then, $B^+$ ions are injected by an amount of $1 \times 10^{16} cm^{-2}$ with the acceleration voltage of 15 KeV into the Ni film 16.

Figure 4B:
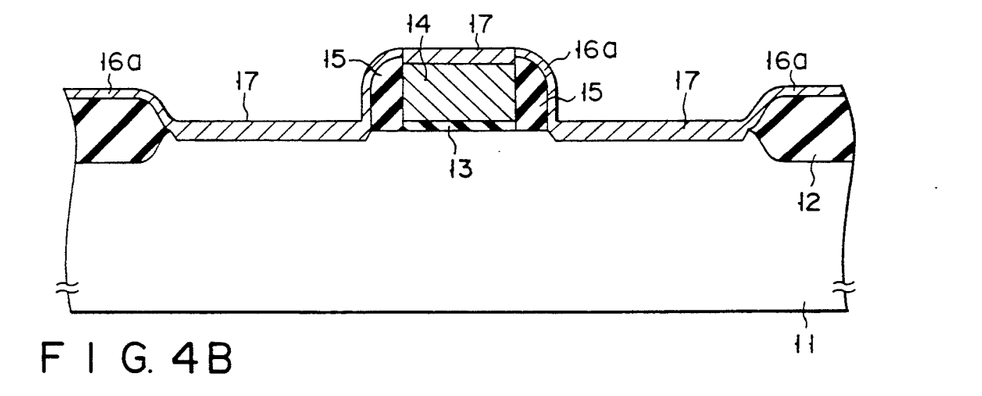
Figure 4C:
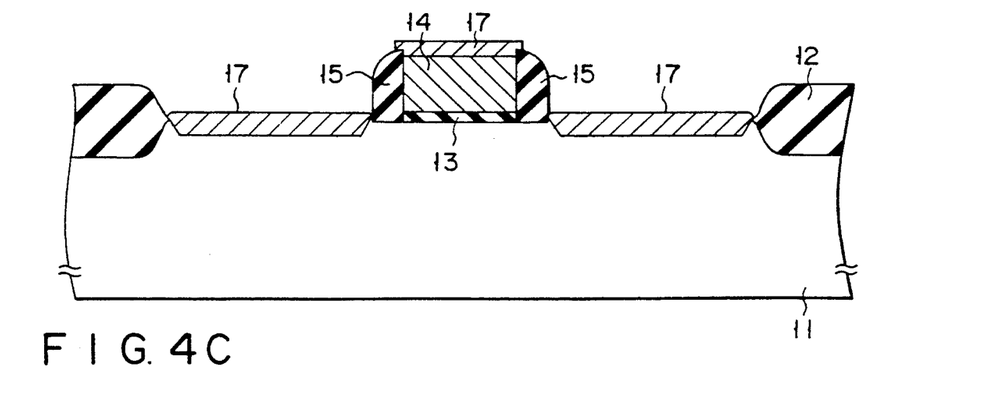

The resultant Si substrate 11 is subjected to a heat treatment under the Ar atmosphere for 40 minutes at 800° C. to form 100-nm thick $NiSi_2$ layers (metal compound layers) 17, as shown in FIG. 4B. Then, the unreacted Ni film 16a is removed using a mixed solution of hydrogen peroxide and hydrochloric acid, as shown in FIG. 4C.

Figure 4D:
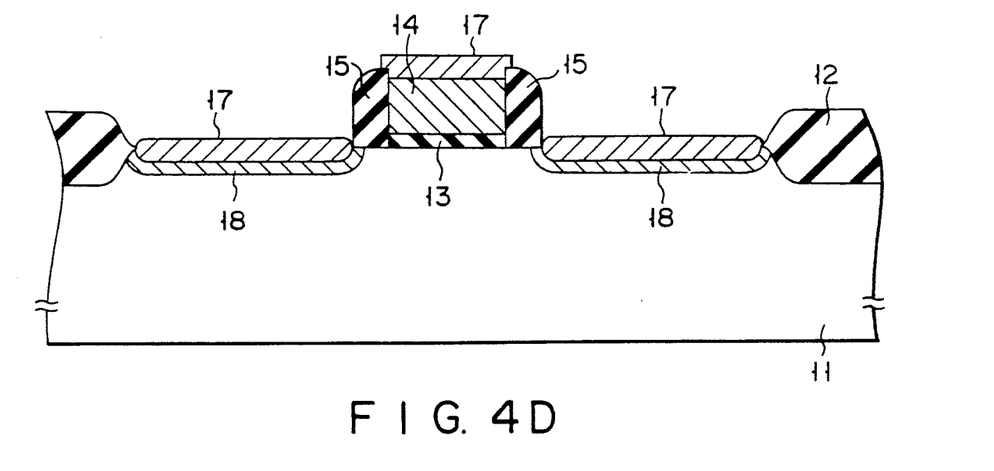

Then, while spraying He gas on the surface of the Si substrate 11 to cool the surface, the back surface of the Si substrate 11 is heated for 30 minutes at 850° C. using a heating apparatus (to be described later) to concentrate the $B^+$ ions at the bottom of the $NiSi_2$ layers 17, forming 40-nm $p^+$ diffusion layers (impurity diffusion layers of the second conductivity type) 18 as shown in FIG. 4D. In forming an n channel MOSFET on the boron-doped p type Si substrate, $As^+$ ions of 80 Kev instead of $B^+$ ions have only to be injected by an amount of $1 \times 10^{16} cm^{-2}$, then the same steps as done in the previous embodiment need to be executed, forming $n^+$ type diffusion layers 18 having a thickness of 25 to 30 nm.

Figure 5:
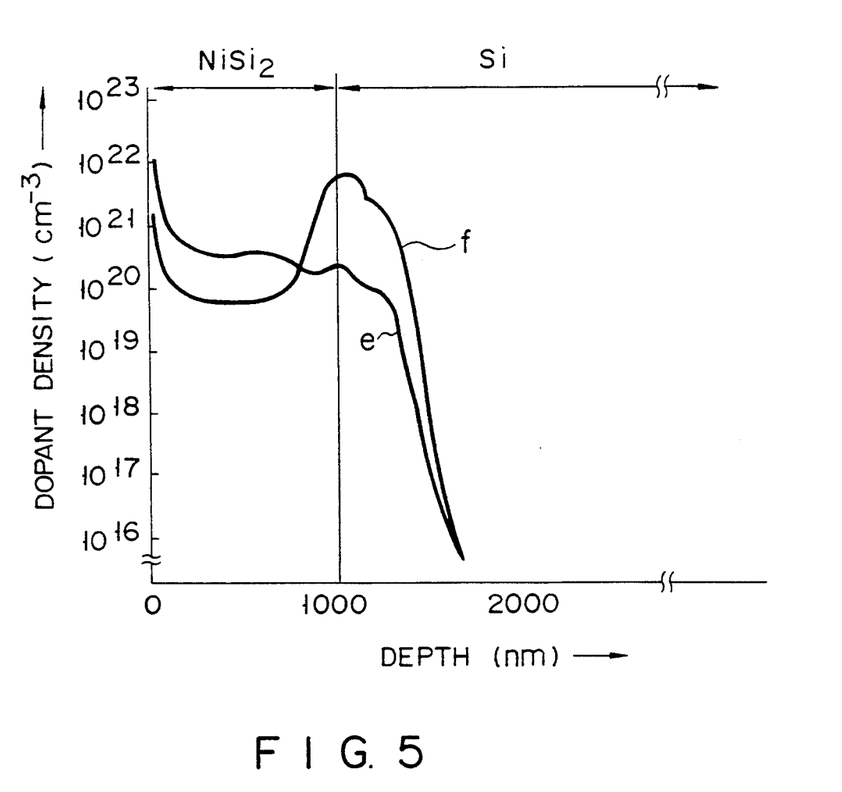
FIG. 5 is a diagram illustrating the distribution of the impurity density of the semiconductor device according to the second embodiment.

The present inventors checked the impurity density of MOSFETs acquired in the above manner. FIG. 5 illustrates the impurity density distribution (curve f) of the Si substrate 11 having the impurity diffusion layers formed, in the direction of the film thickness. This diagram also presents the impurity density distribution (curve e) as a comparative example in a case where the temperature on the metal silicide side and that on the substrate side in the step of diffusing an impurity are set equal to each other. It should be apparent from these curves that this embodiment has a higher impurity density at the interface between the $NiSi_2$ film 17 and the Si substrate 11 than the comparative example. This is because that as the temperature of the $NiSi_2$ layers 17 is higher than that on the side of the Si substrate 11, the segregation coefficient of the impurity between the NiSi$_2$ layers 17 and the Si substrate 11 is made greater on the substrate side to maximize the impurity density on the surface of the Si substrate 11. Since the impurity density at the interfaces between the NiSi$_2$ layers 17 and the impurity diffusion layers 18 is high, the impurity density of the impurity diffusion layers 18 also becomes high.

While the interfaces between the NiSi$_2$ layers 17 and the diffusion layers 18 and the interfaces between the diffusion layers 18 and the substrate 11 are flat in this embodiment, those in the MOSFET using the W silicide as shown in FIG. 3 have an irregular shape. Such unevenly-shaped interfaces would locally generate a large electric field at the pn junction, thus increasing the leak current there. The increase in leak current may damage the pn junction in the Si substrate 11. Particularly, this shortcoming would easily occur when the impurity density of the impurity diffusion layers 18 is low. It is very difficult to form the pn junction with a thickness of 0.1 μ or below by this method. Such a problem does not occur according to this embodiment because the temperature gradient is set as specified above to uniformly diffuse the impurity (B$^+$ ions) into the Si substrate 11 from the interfaces between the NiSi$_2$ layers 17 to the Si substrate 11. Even if the interfaces between the NiSi$_2$ layers 17 and the Si substrate 11 become uneven, the leak current will not easily be increased due to high impurity density of the impurity diffusion layers 18.

This embodiment can provide shallow diffusion layers 18 having a high impurity density and can reduce the resistance of the diffusion layers 18. Further, the interfaces between the NiSi$_2$ layers 17 and the diffusion layers 18 as well as the interfaces between the diffusion layers 18 and the substrate 11 can be made flat, preventing the generation of the leak current. As a result, a MOSFET with high operation speed and high reliability can be acquired.

FIGS. 6A through 6D are cross sections illustrating the steps of manufacturing a semiconductor device according to the third embodiment of the present invention. This embodiment differs from the second one in that ions are injected in an NiSi$_2$ layer, which is an Ni film made silicide, instead of injecting ions directly in the Ni film.

Figure 6A:
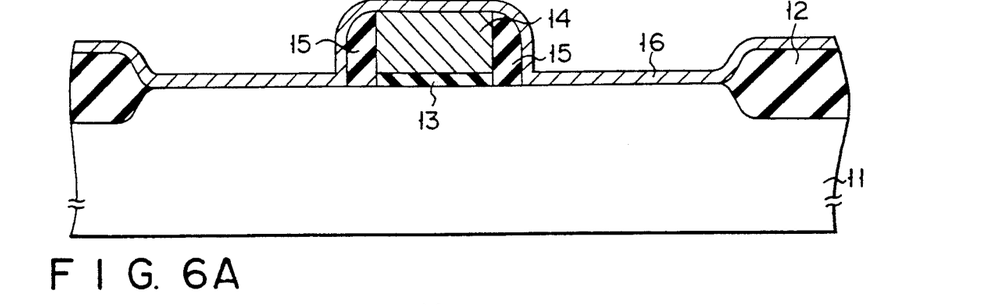
FIGS. 6A to 6D are cross sections illustrating the steps of manufacturing a semiconductor device according to the third embodiment of the present invention.

As shown in FIG. 6A, a field oxidation film 12, a gate oxidation film 13, a polycrystal Si film 14 and a side-wall insulative film 15 are formed on an n type Si substrate 11, then a 300-nm thick Ni film 16 is formed on the entire surface of the Si substrate 11, as per the second embodiment.

Figure 6B:
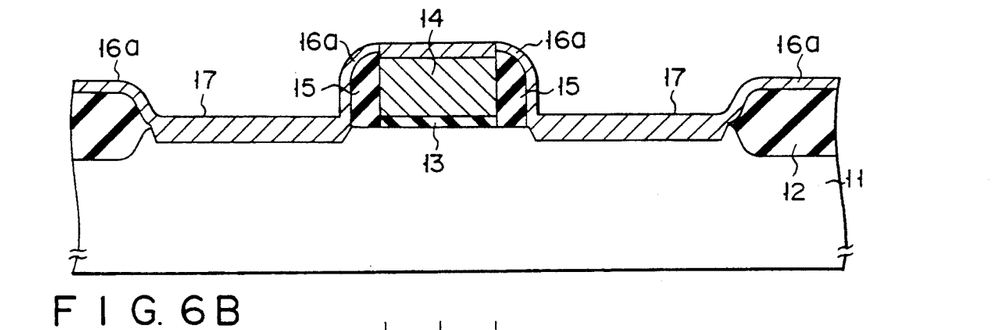
Figure 6C:
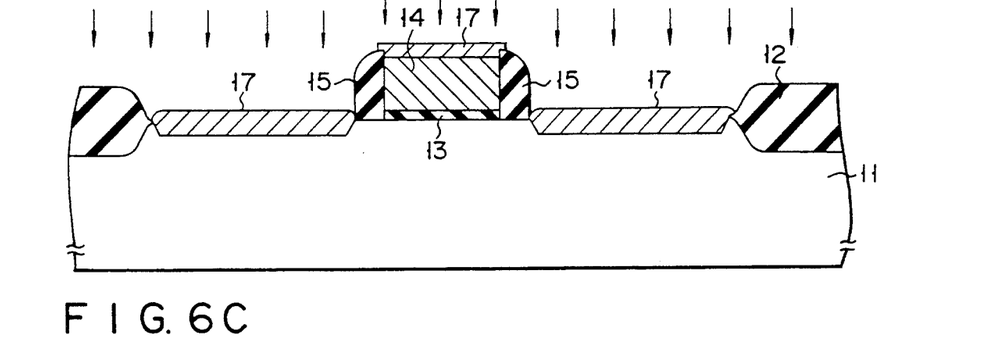

The resultant Si substrate 11 is then subjected to a heat treatment under the Ar atmosphere for 60 minutes at 800° C. to form 100-nm thick NiSi$_2$ layers 17 at a predetermined location on the Si substrate 11, as shown in FIG. 6B. After the unreacted Ni film 16a is removed using a mixed solution of hydrogen peroxide and hydrochloric acid, the B$^+$ ions are injected by an amount of $1 \times 10^{16}$ cm$^{-2}$ with the acceleration voltage of 20-25 KeV into the whole surface of the Si substrate 11, as shown in FIG. 6C.

Figure 6D:
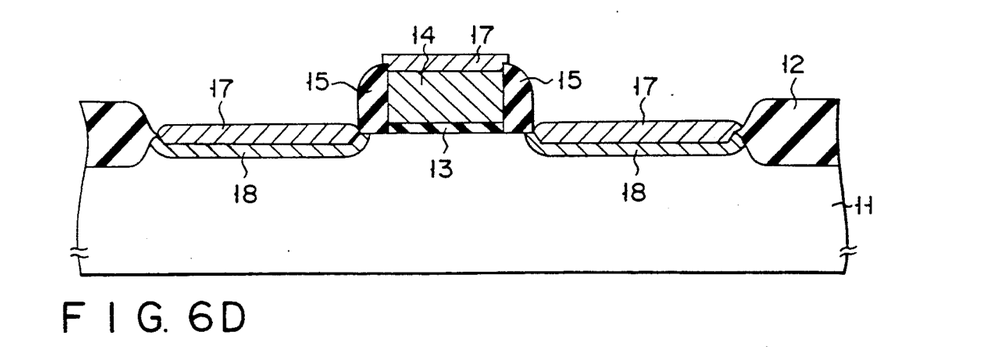

Then while spraying He gas on the surface of the Si substrate 11 to cool the surface, the back surface of the Si substrate 11 is heated for 30 minutes at 850° C. to concentrate the B$^+$ ions at the bottom of the NiSi$_2$ layers 17 as per the second embodiment, forming 40-nm p$^+$ diffusion layers 18, as shown in FIG. 6D.

It was confirmed that the third embodiment can increase the impurity density of the diffusion layers 18 and produce the same effects as the second embodiment.

The fourth embodiment of the present invention will now be discussed.

First, a field oxidation film, gate oxidation film, polycrystal silicon film and side-wall insulative film are formed on the Si substrate as per the second embodiment. Then, the Si substrate is set in a vacuum chamber, and the pressure in the chamber is decreased to $1 \times 10^{-5}$ Pa. Ar is then introduced in the chamber and the pressure in the chamber is increased to 0.3 to 0.7 Pa. Then, Ni is sputtered on the resultant structure to form a 30-nm thick Ni film on the Si substrate, and at the same time, the Si substrate is heated to set the temperature of the substrate to 400° to 500° C. by a tungsten halogen lamp, thereby forming NiSi$_2$ layers with a thickness of 65 to 70 nm on the Si-exposed surface of the Si substrate.

Then, the Si substrate is removed from the chamber, and the unreacted Ni film on the field oxidation film and the side-wall insulative film is removed using a mixed solution of hydrogen peroxide and hydrochloric acid. B$^+$ ions are then injected by an amount of $1 \times 10^{16}$ cm$^{-2}$ in the NiSi$_2$ layers with the acceleration voltage of 20-25 KeV, then the Si substrate is subjected to a heat treatment for 30 to 60 minutes at 800°-900° C. under the N$_2$ or Ar atmosphere having the oxygen density of 1 ppm or below, forming NiSi$_2$ layers having a thickness of approximately 100 nm. At this time, a cooling gas, such as an inactive gas of He, for example, is sprayed on the surface of the Si substrate to make the temperature of the top surface of the Si substrate lower than that of the back surface, thereby concentrating the B$^+$ ions at the bottom of the NiSi$_2$ layers. The subsequent steps are the same as those done in the second embodiment.

Figure 7:
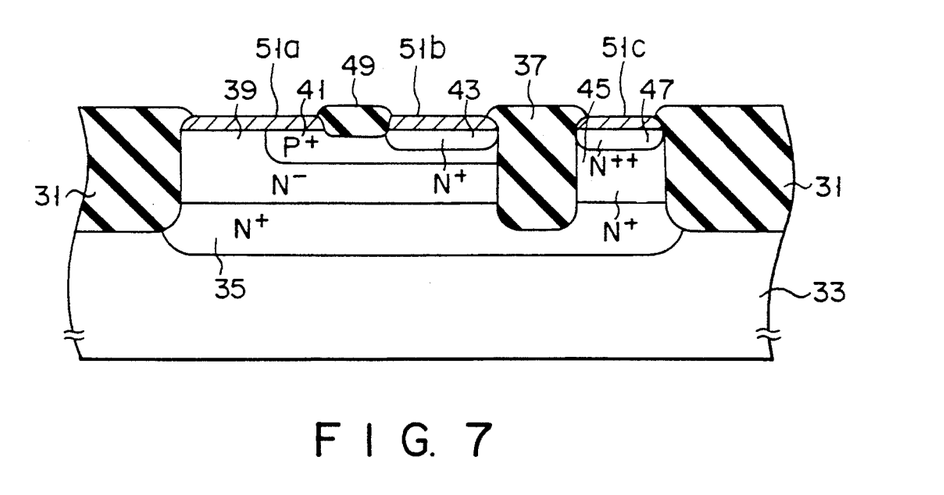
FIG. 7 is a cross section illustrating a semiconductor device according to the fifth embodiment of the present invention.

FIG. 7 is a cross-sectional view of a semiconductor device according to the fifth embodiment of the present invention which is applied to a bipolar transistor.

A p type Si substrate 33 has its surface isolated as a device region by a separation insulative film 31; the surface of this region is a (100) face. An n$^+$ buried layer 35 is formed in the top surface of the p type Si substrate 33. The Si substrate 33 is separated by the insulative film 37 into base/emitter regions and a collector region. An n type epitaxial layer 39 is formed on the n$^+$ buried layer 35 in the base/emitter regions. A base 41 is formed in the epitaxial layer 39, and an emitter 43 is formed on the base. A collector layer 45 and a contact layer 47 are sequentially formed on the n$^+$ buried layer 35 in the collector region. On the surfaces of the n buried layer 35, the base 41, the emitter 43, and the contact layer 47 are respectively provided NiSi$_2$ layers 51a, 51b and 51c, which are isolated by the insulative films 37 and 49. The bottom portions of the NiSi$_2$ layers 51a, 51b, and 51c have (100) faces, while the side portions thereof are surrounded by (111), (1$\bar{1}$1), (11$\bar{1}$), and (1$\bar{1}\bar{1}$) faces.

In the bipolar transistor with such a structure, the NiSi$_2$ layers 51a, 51b, and 51c, grow much slower in the direction parallel to the surface of the Si substrate than in the depth direction of the Si substrate 33, as in the case of the MOS transistor, so that the insulative films 35 and 49 would not be damaged. Accordingly, it is possible to acquire a bipolar transistor with a high reliability. As the base/emitter regions and the collector region are formed shallow, a finer bipolar transistor can be acquired, ensuring the realization of a semiconductor with a high integration.

Figure 8:
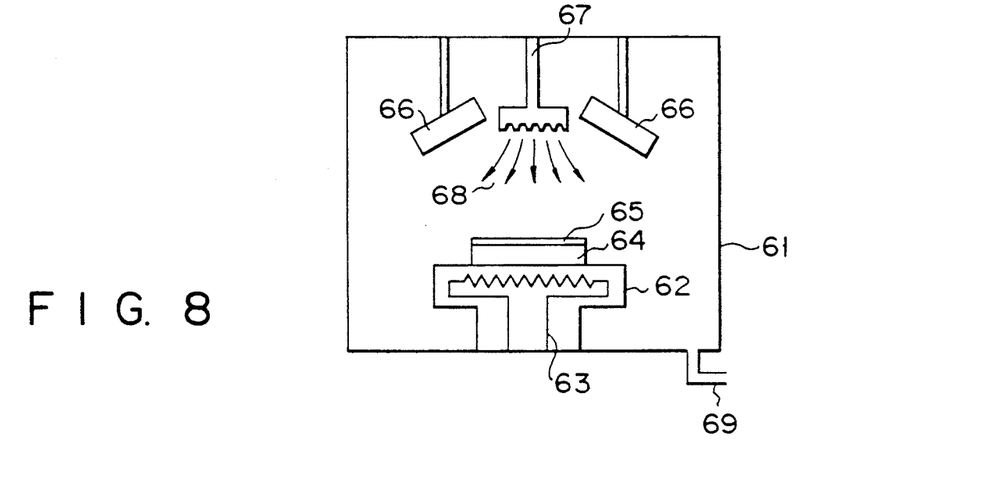
FIG. 8 is a diagram schematically illustrating the structure of a heating apparatus according to the sixth embodiment of the present invention.

The sixth embodiment of the present invention will now be described. This embodiment is a heating apparatus for heating the substrate. As shown in FIG. 8, a heater 63 is arranged inside a susceptor 62 in a chamber 61 for heating the back surface of a substrate 64, while a heater 66 is located in the upper portion of the chamber 61 for heating the top surface of the substrate 64. A gas inlet tube 67 is provided so that a gas flow 68 uniformly hits a thin film layer 65 on the top surface of the substrate 64. A gas outlet tube 68 is located at the lower portion of the chamber 61.

In providing the temperature gradient in the substrate using this apparatus, the temperature in the chamber 61 is first raised to approximately 850° C. by the lamp heater 63. Then, the lamp heater 63 is turned off, and an He gas or Ar gas 68 is sprayed from the gas inlet tube 67 on the top surface of the substrate 64, setting the temperature on the substrate 64 higher than that on the thin film layer 65.

Using this apparatus with the heaters 63 and 66 rendered on can make a silicide of the Ni film 16 in the aforementioned second to fourth embodiments. If the heater 63 is on, the heater 66 is off, and the cold gas is sprayed from the gas inlet tube 67 on the top surface of the substrate 64, it is possible to provide a temperature gradient such that the back surface of the substrate 64 has a higher temperature than the top surface thereof. This allows B+ ions to be collected at the interfaces between the NiSi$_2$ layers 17 and the Si substrate 11. Further, this heating apparatus can effectively integrate B+ ions at the bottom portions of the NiSi$_2$ layers 17. For example, the B+ ions are injected into the NiSi$_2$ layers 17 formed in the same manner as done in the forth embodiment. The substrate 64 is heated for 8 to 30 seconds at 900° to 1050° C. Then, the heater 66 on the top surface side of the substrate 64 is turned off immediately after the heating is over. The cooling gas is sprayed on the surface of the substrate 64 so as to provide the temperature gradient in the substrate 64 and collect the B+ ions at the bottom portions of the NiSi$_2$ layers 17. It is possible through these steps to efficiently collect the B+ ions at the bottom portions of the NiSi$_2$ layers 17. The subsequent steps are the same as those in the second embodiment.

Figure 9:
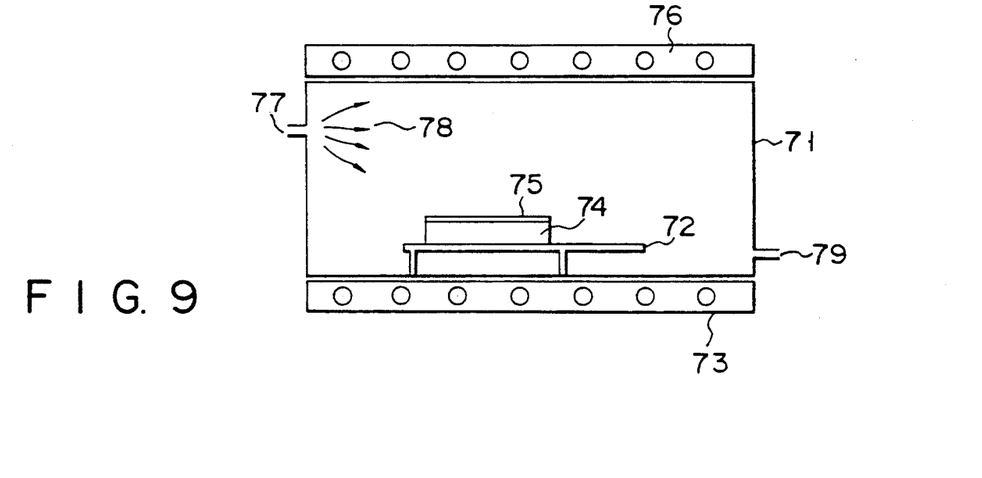
FIG. 9 is a schematic structural diagram of a heating apparatus according to the seventh embodiment of the present invention.

FIG. 9 is a schematic diagram illustrating the structure of a heating apparatus according to the seventh embodiment of the present invention. Lamp heaters 73 and 76 are respectively provided at the upper and lower portions of a chamber 71. Inside the chamber 71 is provided a susceptor 72 on which a substrate 74 is placed. A gas inlet tube 77 and a gas outlet tube 79 are placed as shown in FIG. 9, to allow a gas flow to hit a thin film layer 75. The apparatus with such a structure facilitates the control of the heating temperature on the top and back surface sides of the substrate 74 so that the temperature gradient can be easily provided in the substrate 74.

With this apparatus, the B+ ions can easily be collected at the bottom portions of the NiSi$_2$ layers 17 in the aforementioned third embodiment. That is, the Si substrate 11 is subjected to a heat treatment for 8 to 10 seconds at 900°–1000° C. after B+ ions are injected into the NiSi$_2$ layers 17, and, immediately thereafter, the heating of the top surface side of the Si substrate 11 is stopped and the cooling gas is sprayed on the top surface of the Si substrate 11. This step produces the temperature gradient in the substrate 11, efficiently collecting the B+ ions at the bottom portions of the NiSi$_2$ layers 17.

Like the apparatus of the sixth embodiment, this apparatus can concentrate the B+ ions at the bottom portions of the NiSi$_2$ layers.

The present invention is not restricted to the above-described embodiments. Although a Si substrate is used in these embodiments, a Ge or compound semiconductor substrate may be used as well; for example, GaAs or InP may be used instead of Si. The substrate is not restricted to a wafer sliced from a semiconductor ingot, but other types can be used as long as a semiconductor layer is formed their top. For instance, an SOS or SOI substrate may also be used. The present invention is not restricted to a MOSFET, but can be applied to a Schottky junction type FET, pn junction type FET or hetero junction type FET. The present invention may also be applied to a semiconductor device with a shallow impurity diffusion layer, such as a diode, other than a bipolar transistor.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A semiconductor device comprising:
   a semiconductor substrate of a first conductivity type having a main top surface with a {100} face;
   a gate insulative film selectively formed on said main top surface of said semiconductor substrate;
   metal films formed on said gate insulative film;
   impurity diffusion layers of a second conductivity type selectively formed on said main top surface of said semiconductor substrate; and
   metal compound layers consisting of constituting elements of said semiconductor substrate and a metal element, and formed in said impurity diffusion layers in a manner that said metal compound layers do not contact said gate insulative film, said metal compound layers having bottom portions with {100} faces and side portions with {111} faces.

2. The semiconductor device according to claim 1, wherein said metal compound layers comprise nickel and silicon.

3. The semiconductor device according to claim 1, wherein said metal films have a lamination structure of an impurity-doped polycrystal silicon film and a silicide film.

4. A semiconductor device comprising:
   a semiconductor substrate having a main top surface with a {100} face;
   insulative films formed to separate said main top surface of said semiconductor substrate into base/emitter regions and collector regions;
   a buried layer formed on said main top surface of said semiconductor substrate, separated by said insulative films;
   an epitaxial layer formed on said buried layer in said base/emitter regions defined by said insulative films;
   a base formed on a surface of said epitaxial layer;
   an emitter formed on a surface of said base;

a collector lead-out layer formed on said buried layer in said collector region defined by said insulative films; and metal compound layers consisting of constituting elements of said semiconductor substrate and a metal element, and formed in said base/emitter regions and collector region in a manner where bottom portions of said metal compound layers have {100} faces and side portions of said metal compound layers have {111} faces.

* * * * *